(12) United States Patent
Cheng et al.

(10) Patent No.: US 9,094,038 B2
(45) Date of Patent: *Jul. 28, 2015

(54) COMPRESSING AND DECOMPRESSING SIGNAL DATA

(71) Applicant: International Business Machines Corporation, Armonk, NY (US)

(72) Inventors: Xinhao Cheng, Shanghai (CN); Mingqiang Li, Beijing (CN); Yonghua Lin, Beijing (CN); Qing Wang, Beijing (CN); Chao Xue, Beijing (CN); Rong Yan, Beijing (CN); Hai Zhan, Beijing (CN); Chao Zhu, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 103 days.

This patent is subject to a terminal disclaimer.

(21) Appl. No.: 13/925,275

(22) Filed: Jun. 24, 2013

(65) Prior Publication Data

US 2013/0321182 A1  Dec. 5, 2013

Related U.S. Application Data

(63) Continuation of application No. 13/899,839, filed on May 22, 2013, now Pat. No. 8,902,090.

(30) Foreign Application Priority Data

May 31, 2012 (CN) .......................... 2012 1 0177519

(51) Int. Cl.
*H03M 7/30* (2006.01)
*H04B 1/66* (2006.01)
(Continued)

(52) U.S. Cl.
CPC ................. *H03M 7/30* (2013.01); *G06T 9/005* (2013.01); *H04B 1/665* (2013.01); *H04J 3/1611* (2013.01); *H04N 7/50* (2013.01); *H04N 7/52* (2013.01); *H04N 19/61* (2014.11)

(58) Field of Classification Search
CPC ......... H03M 7/30; G06T 9/005; H04B 1/665; H04J 3/1611; H04N 7/50; H06B 1/40
USPC ........... 341/87; 382/245; 375/240.12, 240.23, 375/219; 704/229
See application file for complete search history.

(56) References Cited

U.S. PATENT DOCUMENTS 7,009,533 B1    3/2006   Wegener
7,593,582 B2    9/2009   Govindaswamy et al.
(Continued)

OTHER PUBLICATIONS

ElectronicDesign, [online]; [retrieved on Jan. 18, 2012]; retrieved from the Internet http://electronicdesign.com/archive/algorithm-delivers-lossless-compression-adc-samples Al Wegener, "Algorithm Delivers Lossless Compression to ADC Samples," Jun. 18, 2010, pp. 1-2.

(Continued)

*Primary Examiner* — Joseph Lauture
(74) *Attorney, Agent, or Firm* — Cantor Colburn LLP

(57) ABSTRACT

The present invention relates to data compression and decompression, and particularly relates to a method and an apparatus for compressing and decompressing signal data. In an embodiment of the present invention, there is disclosed a method for compressing signal data, comprising: obtaining signal data; determining block lengths of a plurality of data blocks into which the signal data are divided, and determining exponents of the data blocks; forming a mantissa sequence of the data block by using the exponent of the data block to compress signal data contained in the data block; and forming a compressed data block by using the block length, the exponent and the mantissa sequence of the data block. By constructing a variable-length data block adapted to dynamic characteristics of signal data, the method for compressing signal data of the present invention increases the compression ratio of signal data.

8 Claims, 7 Drawing Sheets

(51) Int. Cl.
  *H04J 3/16* (2006.01)
  *G06T 9/00* (2006.01)
  *H04N 19/61* (2014.01)
  *H04N 7/52* (2011.01)

(56) References Cited

U.S. PATENT DOCUMENTS 8,902,090 B2 * 12/2014 Cheng et al.

2005/0063368 A1  3/2005  Reznik
2009/0290632 A1  11/2009  Wegener
2011/0099295 A1  4/2011  Wegener

OTHER PUBLICATIONS

Florin Ghido, "An Introduction to Lossless Audio Compression," Department of Signal Processing, SGN-2306 Signal Compression, May 2010, pp. 1-31.

* cited by examiner

COMPRESSING AND DECOMPRESSING SIGNAL DATA

PRIORITY

This application is a continuation of U.S. Patent Application Ser. No. 13/899,839, filed May 22, 2013, now U.S. Pat. No. 8,902,090, which claims priority to Chinese Patent Application No. 201210177519.8, filed May 31, 2012, and all the benefits accruing therefrom under 35 U.S.C. §119, the contents of which in its entirety are herein incorporated by reference.

BACKGROUND

The present invention relates to data compression and decompression, and more specifically, to methods and apparatuses for compressing and decompressing signal data.

In the field of wireless signal processing, e.g., in a base transceiver system or an information acquisition and processing system, a signal is typically modulated into two orthogonal data branches, i.e. I and Q data branches, and in a digital signal processor, the two data branches I and Q are usually represented by fixed-length fixed-point numbers (taking a 16-bit analog-to-digital converter as an example, if an analog signal is inputted, outputted two data branches I and Q are both 16-bit binary fixed-point numbers). These I/Q data have the following characteristics:

(1) A relatively larger set of data. Taking 16-bit I/Q data as an example, a size of the data set is $2^{16}$.

(2) Relatively low percentage of occurrences frequency of a single numeric value, which is usually lower than 1%.

(3) Close value ranges of consecutive data. Taking 16-bit I/Q data as an example, several consecutive data might fall within a range of $[2^6, 2^7)$.

Compression of I/Q signal data with the foregoing characteristics enables more efficient use of resources. Specifically, in a base transceiver system, a compressor performs compression to signal data whereby the amount of signal data in transmission links can be reduced and thus the bandwidth can be saved; in an information acquisition and processing system, a compressor performs compression to signal data whereby the amount of signal data to be stored can be reduced and thus the capacity of storage devices can be saved.

However, traditional data compression methods based on information entropy theory, either statistics-based Huffman coding and arithmetic coding, or dictionary-based compression methods (like LZW), are far from satisfactory in terms of compression complexity, decompression complexity and compression efficiency. "A relatively larger set of data" means maintaining and storing a relatively larger table, which makes the compression complexity and decompression complexity relatively high; "relatively low percentage of occurrences frequency of a single numeric value" implies relatively bad compression efficiency.

Therefore, there is a need for a high-efficiency compression method for signal data.

SUMMARY

In one embodiment, a method for compressing signal data includes obtaining signal data; determining block lengths of a plurality of data blocks into which the signal data are divided, and determining exponents of the data blocks; forming a mantissa sequence of the data block by using the exponent of the data block to compress signal data contained in the data block; and forming a compressed data block by using the block length, the exponent and the mantissa sequence of the data block.

In another embodiment, a method for decompressing compressed signal data, includes obtaining compressed signal data; obtaining a block length and an exponent of a data block from the compressed signal data; obtaining a mantissa sequence of the data block according to the block length and the exponent of the data block; and restoring original signal data corresponding to the data block by using the mantissa sequence and the exponent.

In another embodiment, an apparatus for compressing signal data, includes an obtainment module configured to obtain signal data; a block length and exponent determination module configured to determine block lengths of a plurality of data blocks into which the signal data are divided, and determine exponents of the data blocks; a mantissa sequence formation module configured to form a mantissa sequence of the data block by using the exponent of the data block to compress signal data contained in the data block; and a compressed data block formation module configured to form a compressed data block by using the block length, the exponent and the mantissa sequence of the data block.

BRIEF DESCRIPTION OF THE SEVERAL VIEWS OF THE DRAWINGS

The above and other objects, features and advantages of the present disclosure will become more apparent through the more detailed description of exemplary embodiments of the present disclosure in conjunction with the accompanying drawings in which like reference numbers generally refer to like components in the embodiments of the present disclosure.

DETAILED DESCRIPTION

Some exemplary embodiments of the present disclosure will be described in more detail with reference to the accompanying drawings. The exemplary embodiments of the present disclosure have been illustrated in the accompanying drawings; however it should be appreciated that the present disclosure can be implemented in various manners, and is not limited to the embodiments disclosed herein. On the contrary, those embodiments are provided for the thorough and complete understanding of the present disclosure, and completely conveying the scope of the present disclosure to those skilled in the art.

By constructing a variable-length data block adapted to dynamic characteristics of signal data, a method for compressing signal data according to the embodiments of the present invention makes compression of signal data have robustness, thereby increasing the compression ratio of signal data.

Figure 1:
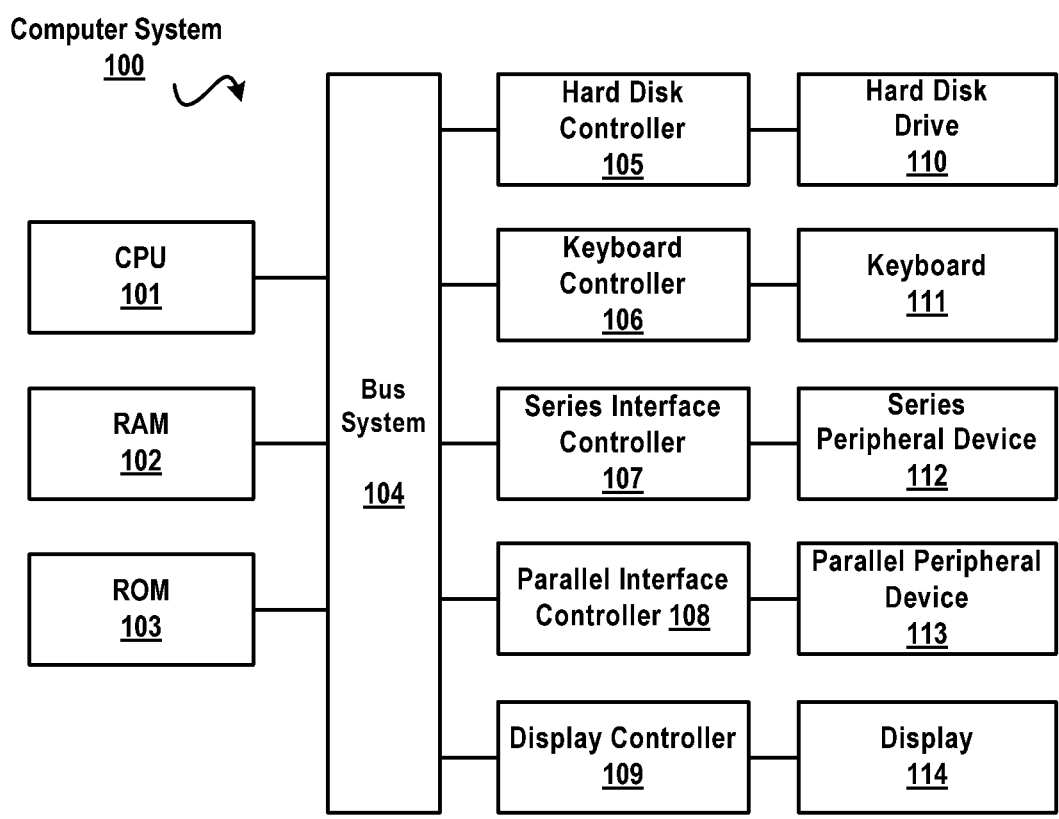
FIG. 1 shows an exemplary computer system which is applicable to implement an embodiment of the present invention.

FIG. 1 shows a block diagram of an exemplary computer system 100 which can be used to implement the embodiments of the present invention. As shown in FIG. 1, the computer system 100 may include: CPU (Central Process Unit) 101, RAM (Random Access Memory) 102, ROM (Read Only Memory) 103, System Bus 104, Hard Drive Controller 105, Keyboard Controller 106, Serial Interface Controller 107, Parallel Interface Controller 108, Display Controller 109, Hard Drive 110, Keyboard 111, Serial Peripheral Device 112, Parallel Peripheral Device 113 and Display 114. Among above devices, CPU 101, RAM 102, ROM 103, Hard Drive Controller 105, Keyboard Controller 106, Serial Interface Controller 107, Parallel Interface Controller 108 and Display Controller 109 are coupled to the System Bus 104. Hard Drive 110 is coupled to Hard Drive Controller 105. Keyboard 111 is coupled to Keyboard Controller 106. Serial Peripheral Device 112 is coupled to Serial Interface Controller 107. Parallel Peripheral Device 113 is coupled to Parallel Interface Controller 108. In addition, Display 114 is coupled to Display Controller 109. It should be understood that the structure as shown in FIG. 1 is only for the exemplary purpose rather than any limitation to the present invention. In some cases, some devices may be added to or removed from the computer system 100 as required by specific situations.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining of software and hardware, aspects that may all generally be referred to herein as a "circuit," "module" or "system." Furthermore, aspects of the present invention may take the form of a computer program product embodied in one or more computer readable medium(s) having computer readable program codes embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination thereof. More specific examples (a non-exhaustive list) of the computer readable storage medium would include: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention will be described below with reference to flowchart illustrations and/or block diagrams of methods, apparatus (systems) and computer program products according to embodiments of the invention. It will be understood that each block of the flowchart and/or block diagrams, and combinations of blocks in the flowchart and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/operations specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions means for implementing the functions/operations specified in the flowchart and/or block diagram block or blocks.

The computer program instructions may also be loaded onto a computer, other programmable data processing apparatus, or other devices to cause a series of operational to be performed on the computer, other programmable data processing apparatus or other devices to produce a computer implemented process such that the instructions which execute on the computer or other programmable apparatus provide processes for implementing the functions/operations specified in the flowcharts and/or block diagram block or blocks.

Figure 2:
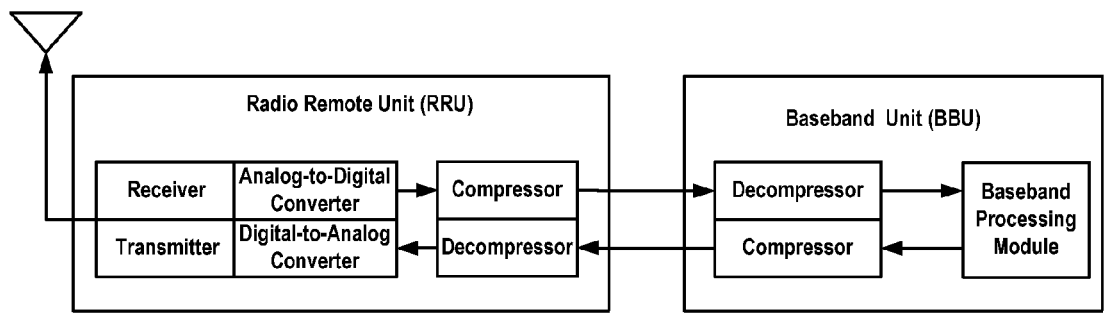
FIG. 2 shows a block diagram of a base transceiver system according to an embodiment of the present invention.

FIG. 2 shows a block diagram of a base transceiver system according to an embodiment of the present invention. For the uplink, a receiver in a radio remote unit receives a signal from an antenna, the signal is converted into signal data via an analog-to-digital converter, the signal data is compressed by a compressor and is sent to a baseband unit over a data transmission link, the compressed signal data is decompressed by a decompressor in the baseband unit, and finally the decompressed signal data is sent to a subsequent baseband processing module. For the downlink, the baseband processing module in the baseband unit sends a baseband signal to a compressor, the baseband signal is compressed by the compressor and subsequently sent to the radio remote unit over the data transmission link, a decompressor in the radio remote unit decompresses the received compressed signal data and sends the decompressed signal data to a digital-to-analog converter where the decompressed signal data is converted into a wireless signal and subsequently sent by a transmitter. A method for compressing signal data according to an embodiment of the present invention may be implemented in the compressors in the radio remote unit and the baseband unit, and a method for decompressing compressed signal data according to an embodiment of the present invention may be implemented either in the decompressor in the radio remote unit and may also be implemented in the decompressor in the baseband unit.

Figure 3:
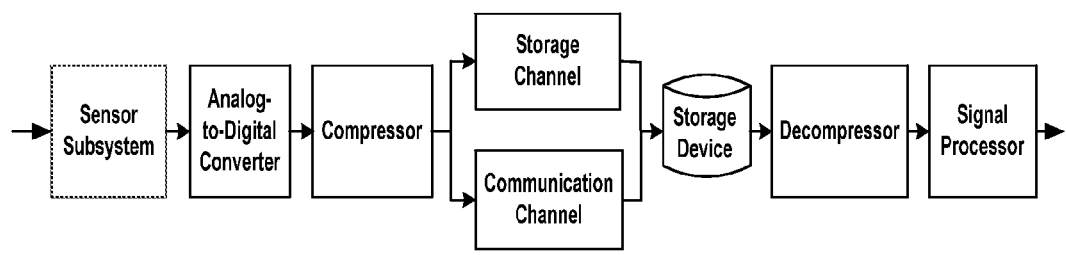
FIG. 3 shows a block diagram of an information acquisition and processing system according to an embodiment of the present invention.

FIG. 3 shows a block diagram of an information acquisition and processing system according to an embodiment of the present invention. A signal acquired by a sensor subsystem is converted into signal data by an analog-to-digital converter, a compressor compresses the signal data, the compressed signal data is sent to a storage device via a storage channel or a communication channel, the compressed signal data in the storage device is decompressed by a decompressor, and then the decompressed signal data is delivered to a signal processor for processing. A method for compressing signal data according to an embodiment of the present invention may be implemented in the compressor, and a method for decompressing compressed signal data according to an embodiment of the present invention may be implemented in the decompressor.

Figure 4:
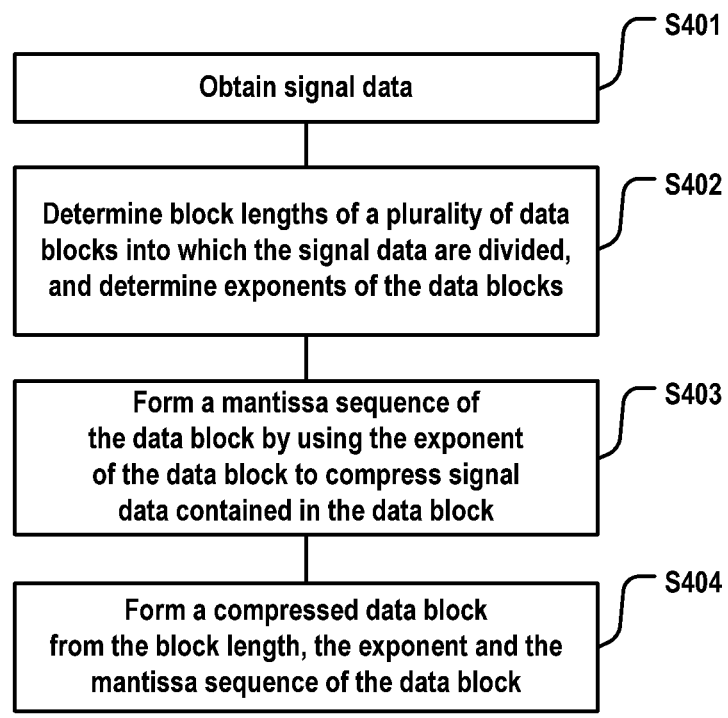
FIG. 4 shows a method for compressing signal data according to an embodiment of the present invention.

FIG. 4 shows a method for compressing signal data according to an embodiment of the present invention. The method comprises: in operation S401, obtaining signal data; in operation S402, determining block lengths of a plurality of data blocks into which the signal data are divided and exponents of the data blocks; in operation S403, forming a mantissa sequence of a data block by using the exponent to compress signal data contained in the data block; in operation S404, forming a compressed data block from the block length, the exponent and the mantissa sequence of the data block.

The signal data obtained in operation S401 is generated by an analog-to-digital converter and stored in a buffer in advance.

Figure 5:
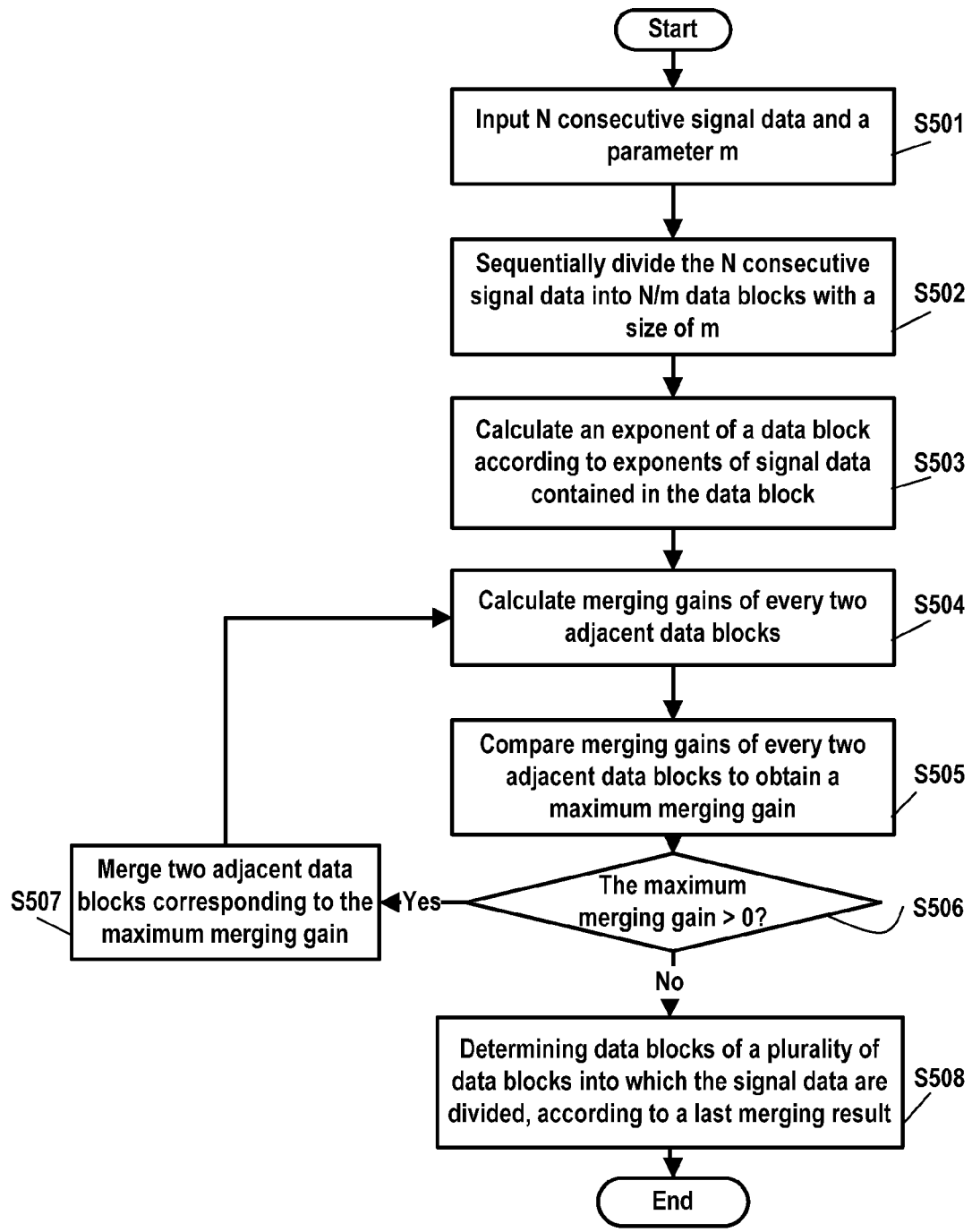
FIG. 5 shows a flowchart of determining block lengths of a plurality of data blocks into which the signal data are divided and exponents of the data blocks according to an embodiment of the present invention.

FIG. 5 shows a flowchart of determining block lengths of a plurality of data blocks into which the signal data are divided and determining exponents of the data blocks, according to an embodiment of the present invention.

In operation S501, N consecutive signal data and a parameter m are inputted, wherein m is an arbitrary integer that can be exactly divided by N.

In operation S502, the N signal data are sequentially divided into N/m data blocks $B_1, B_2, \ldots B_k$ with a size of m.

In operation S503, an exponent of a data block is calculated according to exponents of signal data contained in the data block, wherein E(B) is defined as an exponent of a data block B.

$$E(B) = \min_{d_j \in B}(e(d_j))$$

wherein $e(d_j)$ denotes an exponent of a signal data $d_j$, and is defined as the number of consecutive bits counting rightward from the next bit of a sign bit of signal data $d_j$, each of the consecutive bits having a value identical to the numeric value of this sign bit.

In operation S504, merging gains G of every two adjacent data blocks are calculated. Specifically, a merging gain of two adjacent data blocks is calculated according to the exponents, the bit numbers of block length tokens, the bit numbers of the exponent tokens, and the block lengths of the two adjacent data blocks. First of all, compression amounts $v(B_i)$ and $v(B_{i+1})$ of two adjacent data blocks $B_i$ and $B_{i+1}$ are calculated respectively. Then, compression amount $v(B_i \cup B_{i+1})$ of a new data block generated by merging the two adjacent data blocks $B_i$ and $B_{i+1}$ is calculated, and a merging gain of the two adjacent data blocks $B_i$ and $B_{i+1}$ is $G_{i,i+1} = v(B_i \cup B_{i+1}) - (v(B_i) + v(B_{i+1}))$. For a given data block B, its compression amount v(B) is calculated as $v(B) = E(B) \cdot |B| - \text{TokenSize}\langle B\langle -\text{TokenSize}\langle E(B)\langle$, wherein |B| denotes a block length of the data block B, namely the number of signal data being contained; TokenSize$\langle B\langle$ denotes the bit number of the length token of the data block B, and TokenSize$\langle E(B)\langle$ denotes the bit number of the exponent E(B) token of the data block B. For example, if it is specified in advance that the length token and exponent token of the data block B are denoted by 3-bit binary numbers, then both TokenSize$\langle B\langle$ and TokenSize$\langle E(B)\langle$ are 3.

In operation S505, merging gains of every two adjacent data blocks are compared so as to obtain a maximum merging gain. In operation S506, it is determined whether or not the maximum merging gain is larger than 0. If yes, two adjacent data blocks corresponding to the maximum merging gain are merged in operation S507, and then the flow returns to operation S504. If not, i.e., the maximum merging gain is less than or equal to 0, then block lengths of data blocks into which signal data are divided are determined according to the last merging result in operation S508. For example, for 32 signal data, if the last merging result is 8, 4, 6, 4, 2, 8, it indicates that the 32 signal data is sequentially divided into 6 data blocks, wherein a block length of the first data block is 8, i.e., containing 8 signal data; the second data block contains 4 signal data, and so on.

Figure 6:
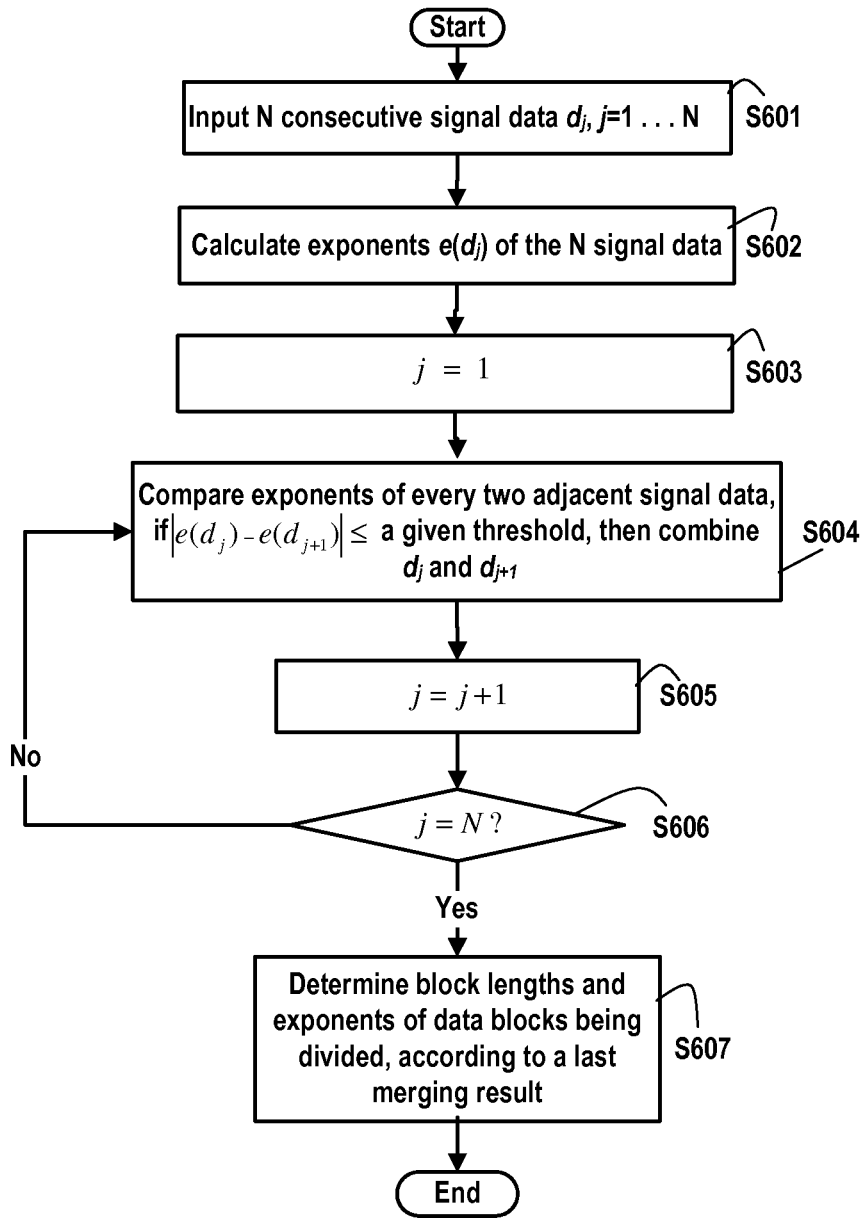
FIG. 6 shows a flowchart of determining block lengths of a plurality of data blocks into which the signal data are divided and exponents of the data blocks according to another embodiment of the present invention.

FIG. 6 shows a flowchart of determining block lengths of a plurality of data blocks into which the signal data are divided and exponents of the data blocks, according to another embodiment of the present invention. In operation S601, N consecutive signal data $d_j$ are inputted. In operation S602, exponents $e(d_j)$ of the N consecutive signal data $d_j$ (j=1, ..., N) are calculated, wherein the exponent $e(d_j)$ is defined as the number of consecutive bits counting rightward from the next bit of a sign bit of signal data $d_j$, each of the consecutive bits having a value identical to a numeric value of this sign bit. In operation S603, 1 is assigned to j. In operation S604, the exponents $e(d_j)$ and $e(d_{j+1})$ of two adjacent signal data are compared; if $|e(d_j) - e(d_{j+1})| \leq$ a given threshold, then the two adjacent signal data $d_j$ and $d_{j+1}$ is merged. In operation S605, j=j+1. In operation S606, it is determined whether or not j is equal to N. If not, the flow returns to operation S604. If yes, then in operation S607, block lengths of a plurality of data blocks into which the signal data are divided and the exponents of the data blocks are determined according to the last merging result, wherein E(B) is defined as an exponent of a data block B.

$$E(B) = \min_{d_j \in B}(e(d_j))$$

Figure 7:
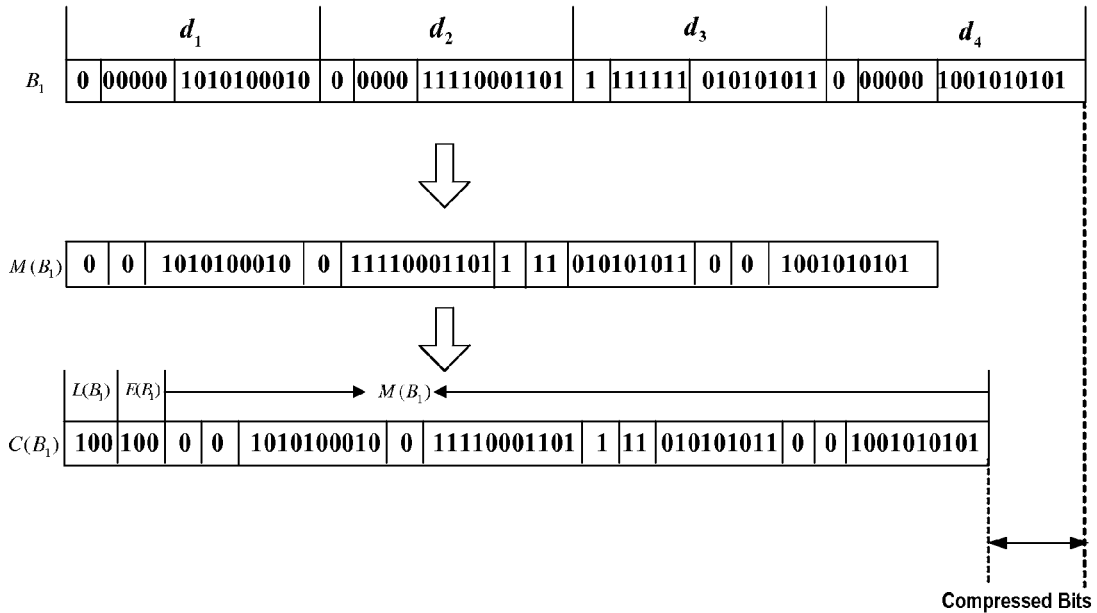
FIG. 7 shows an example of generating a mantissa sequence and a compressed data block according to an embodiment of the present invention.

Then in operation S403 of FIG. 4, signal data contained in a data block is compressed using the exponent, so as to form a mantissa sequence of the data block. Specifically, the number of bits by which the signal data contained in the data block is compressed is determined by the exponent of the data block, i.e., the number of bits reduced by compressing the signal data contained in the data block is equal to the exponent of the data block. The compressed data block forms a mantissa sequence of the data block. For example, the exponent E(B) of a data block B is equal to 4, then each signal data contained in the data block is compressed by 4 bits from the next bit of its sign bit, whereby a mantissa sequence M(B) of the data block B is obtained. FIG. 7 shows an example of generating a mantissa sequence and a compressed data block according to an embodiment of the present invention, wherein the data block $B_1$ consists of signal data $d_1$, $d_2$, $d_3$ and $d_4$, the block length $L(B_1)$ of the data block is equal to 4, and the exponent $E(B_1)$ of the data block is equal to 4. The 4 signal data contained in the data block $B_1$ are compressed wherein the signal data $d_1$ is compressed by 4 bits starting from the next bit of the sign bit, i.e., "00000" is compressed into "0"; the signal data $d_2$ is compressed by 4 bits starting from the next bit of the sign bit, i.e., "0000" is all reduced; the signal data $d_3$ is compressed by 4 bits starting from the next bit of the sign bit, i.e., "111111" is compressed into "11"; the signal data $d_4$ is compressed by 4 bits starting from the next bit of the sign bit, i.e., "00000" is compressed into "0"; and finally the mantissa sequence $M(B_1)$ is obtained.

In operation S404, a compressed data block is formed by using the block length, the exponent and the mantissa sequence of the data block. Specifically, the block length of the data block is converted into a binary block length token, and the exponent of the data block is converted into a binary exponent token. Regarding the example shown in FIG. 7, for example, supposing that the block length of the data block $B_1$ is equal to 4, and the exponent $E(B_1)$ of the data block $B_1$ is equal to 4 and if it is specified in advance that the length token and the exponent token of the data block $B_1$ are denoted by 3-bit binary numbers, then the block length token of the data block $B_1$ is 100, the exponent token is 100. The 3-bit length token (100) and the 3-bit exponent token (100) are added before the mantissa sequence $M(B_1)$, thereby forming a compressed data block $C(B_1)$ from the length token, the exponent token and the mantissa sequence. By constructing a variable-length data block adapted to dynamic characteristics of signal data, the method for compressing signal data according to embodiments of the present invention make compression of signal data more robust, thereby increasing the compression ratio of signal data.

Figure 8:
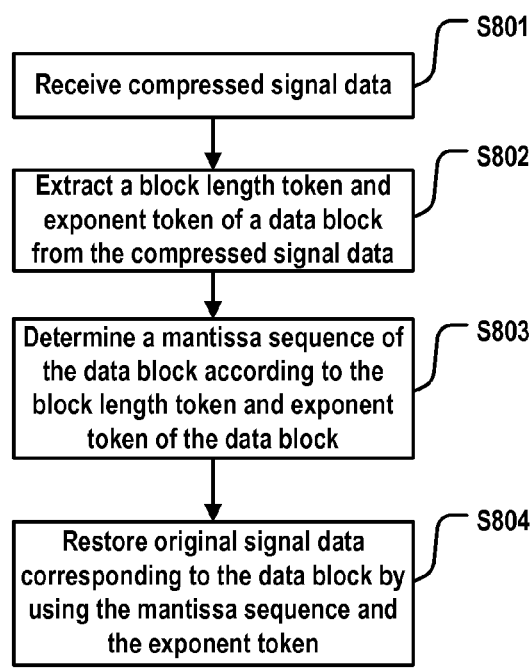
FIG. 8 shows a method for decompressing compressed signal data according to an embodiment of the present invention.

FIG. 8 shows a method for decompressing compressed signal data according to an embodiment of the present invention. In operation S801, compressed signal data is obtained. In operation S802, a block length and an exponent of a data block are obtained from the compressed signal data. In operation S803, a mantissa sequence of the data block is obtained according to the block length and the exponent of the data block. In operation S804, original signal data corresponding to the data block is restored by using the mantissa sequence and the exponent.

Decompression of signal data is a reverse process of compression of signal data, wherein the obtaining a block length and an exponent of a data block from the compressed signal data may comprise: extracting a length token and an exponent token from the compressed signal data according to a predetermined bit number; converting the length token into a block length of a data block; and converting the exponent token into an exponent of the data block.

The obtaining a mantissa sequence of the data block according to the block length and the exponent of the data block may comprise: determining the number of bits by which each signal data contained in the data block is compressed, according to the exponent; determining a length of the mantissa sequence according to the block length of the data block and the number of bits by which the data block is compressed; and obtaining the mantissa sequence from the compressed signal data according to the length of the mantissa sequence.

Please refer to the description of the compression method for definitions of a block length, an exponent and a mantissa sequence of a data block and specific implementation details in the decompression method, which are not detailed here.

Figure 9:
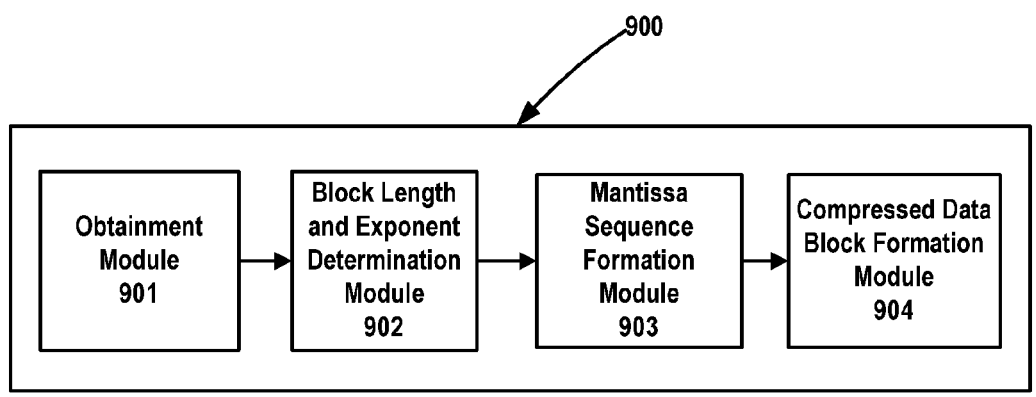
FIG. 9 shows an apparatus for compressing signal data according to an embodiment of the present invention.

Based on the same inventive concept, the present invention proposes an apparatus for compressing signal data and an apparatus for decompressing compressed signal data. FIG. 9 shows an apparatus 900 for compressing signal data according to an embodiment of the present invention. The apparatus 900 comprises: an obtainment module 901 configured to obtain signal data; a block length and exponent determination module 902 configured to determine block lengths of a plurality of data blocks into which the signal data are divided and to determine exponents of the data blocks; a mantissa sequence formation module 903 configured to form a mantissa sequence of a data block by using the exponent of the data block to compress signal data contained in the data block; and a compressed data block formation module 904 configured to form a compressed data block by using the block length, the exponent and the mantissa sequence of the data block.

According to the embodiments of the present invention, the block length and exponent determination module may comprise:

an initial data block division module configured to initially divide the signal data into a plurality of data blocks;

an exponent calculation module configured to calculate an exponent of a data block according to exponents of signal data contained in the data block, wherein E(B) is defined as the exponent of a data block B, $$E(B) = \min_{d_j \in B}(e(d_j))$$

wherein $e(d_j)$ denotes an exponent of signal data $d_j$, and is defined as the number of consecutive bits counting rightward from the next bit of a sign bit of signal data $d_j$, each of consecutive bits having a value identical to a numeric value of this sign bit;

a merging gain calculation module configured to calculate a merging gain of two adjacent data blocks according to the exponents, the bit numbers of block length tokens, the bit numbers of exponent tokens, and the block lengths of the two adjacent data blocks;

a merging gain comparison module configured to compare the merging gains so as to obtain a maximum merging gain;

a determination module configured to determine whether or not the maximum merging gain is larger than 0;

a merging module configured to merge two adjacent data blocks corresponding to the maximum merging gain, in the event the maximum merging gain is larger than 0;

a block length determination module configured to determine block lengths of a plurality of data blocks into which the signal data are divided according to the last merging result, in the event the maximum merging gain is not larger than 0.

According to the embodiments of the present invention, the mantissa sequence formation module is configured to compress signal data contained in the data block from the next bit of their respective sign bits, wherein the number of compressed bits is determined by the exponent of the data block.

According to the embodiments of the present invention, the compressed data block formation module is configured to form a block length token from the block length of the data block according to a predetermined bit number; form an exponent token from the exponent of the data block according to a predetermined bit number; and combine the block length token, the exponent token and the mantissa sequence into the compressed data block in a high-to-low bit order.

According to the embodiments of the present invention, the block length token is a binary code generated by converting the block length of the data block according to a predetermined bit number, and the exponent token is a binary code generated by converting the exponent of the data block according to a predetermined bit number.

Please refer to the description of the compression method for definitions of a block length, an exponent and a mantissa sequence of a data block and specific implementation details in the apparatus 900, which are not detailed here.

Figure 10:
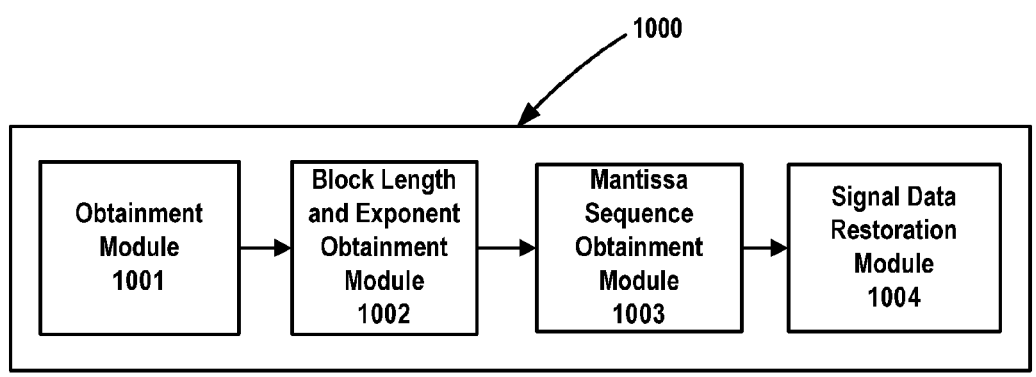
FIG. 10 shows an apparatus for decompressing signal data according to an embodiment of the present invention.

FIG. 10 shows an apparatus 1000 for decompressing signal data according to an embodiment of the present invention. The apparatus 1000 may comprise: an obtainment module 1001 configured to obtain compressed signal data; a block length and exponent obtainment module 1002 configured to obtain a block length and an exponent of a data block from the compressed signal data; a mantissa sequence obtainment module 1003 configured to obtain a mantissa sequence of the data block according to the block length and the exponent of the data block; and a signal data restoration module 1004 configured to restore original signal data corresponding to the data block by using the mantissa sequence and the exponent.

According to the embodiments of the present invention, the block length and exponent obtainment module is configured to: extract a length token and an exponent token from the compressed signal data according to a predetermined bit number; convert the length token into a block length of the data block; and convert the exponent token into an exponent of the data block.

According to the embodiments of the present invention, the mantissa sequence obtainment module is configured to: determine the bit number by which each signal data contained in the data block is compressed, according to the exponent; determine a length of the mantissa sequence according to the block length of the data block and the bit number by which the data block is compressed; and obtain the mantissa sequence from the compressed signal data according to the length of the mantissa sequence.

The apparatus 900 for compressing signal data and the apparatus 1000 for decompressing signal data according to the embodiments of the present invention may be implemented as the compressor and the decompressor in the baseband unit and the radio remote unit in the base transceiver system as shown in FIG. 2, respectively, or implemented as the compressor and the decompressor in the information acquisition and processing system as shown in FIG. 3, respectively.

Please refer to the description of the compression method for definitions of a block length, an exponent and a mantissa sequence of a data block and specific implementation details in the apparatus 1000, which are not detailed here.

The flowchart and block diagrams in the Figures illustrate the architecture, functionality, and operation of possible implementations of systems, methods and computer program products according to various embodiments of the present invention. In this regard, each block in the flowchart or block diagrams may represent a module, a program segment, or a portion of codes, comprising one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. An apparatus for compressing signal data, comprising: an obtainment module configured to obtain signal data;
a block length and exponent determination module configured to determine block lengths of a plurality of data blocks into which the signal data are divided and determine exponents of the data blocks;
a mantissa sequence formation module configured to form a mantissa sequence of the data block by using the exponent of the data block to compress signal data contained in the data block; and
a compressed data block formation module configured to form a compressed data block from the block length, the exponent and the mantissa sequence of the data block.

2. The apparatus according to claim 1, wherein the block length and exponent determination module comprises:
an initial data block division module configured to initially divide the signal data into a plurality of data blocks;
an exponent calculation module configured to calculate an exponent of a data block according to exponents of signal data contained in the data block, wherein E(B) is defined as an exponent of a data block B, $$E(B) = \min_{d_j \in B}(e(d_j))$$

wherein $e^{(d_j)}$ denotes an exponent of signal data dj, and is defined as the number of consecutive bits counting rightwards from the next bit of a sign bit of signal data dj, each of consecutive bits having a value identical to a numeric value of the sign bit;

a merging gain calculation module configured to calculate a merging gain of two adjacent data blocks according to exponents of the two adjacent data blocks, bit numbers of block length tokens, bit numbers of exponent tokens, and the block lengths;

a merging gain comparison module configured to compare the merging gains so as to obtain a maximum merging gain;

a determining module configured to determine whether the maximum merging gain is larger than 0;

a merging module configured to merge two adjacent data blocks corresponding to the maximum merging gain, in the event that the maximum merging gain is larger than 0; and a block length determination module configured to determine block lengths of a plurality of data blocks into which the signal data are divided according to a last merging result in the event that the maximum merging gain is not larger than 0.

3. The apparatus according to claim 1, wherein the mantissa sequence formation module configured to: compress signal data contained in the data block from the next bit of a sign bit, wherein the number of bits by which the signal data is compressed are determined by the exponent of the data block, and the compressed data block forms a mantissa sequence of the data block.

4. The apparatus according to claim 3, wherein the compressed data block formation module is configured to:

generate a block length token from the block length of the data block according to a predetermined bit number;

generate an exponent token from the exponent of the data block according to a predetermined bit number;

combine the block length token, the exponent token and the mantissa sequence into a compressed data block in a high-to-low bit order.

5. The apparatus according to claim 4, wherein the block length token is generated by performing binary coding to the block length of the data block according to a predetermined bit number, and the exponent token is generated by performing binary coding to the exponent of the data block according to a predetermined bit number.

6. An apparatus for decompressing compressed signal data, comprising:

an obtainment module configured to obtain compressed signal data;

a block length and exponent obtainment module configured to obtain a block length and an exponent of a data block from the compressed signal data;

a mantissa sequence obtainment module configured to obtain a mantissa sequence of the data block according to the block length and the exponent of the data block; and a signal data restoration module configured to restore original signal data corresponding to the data block by using the mantissa sequence and the exponent.

7. The apparatus according to claim 6, wherein the block length and exponent obtainment module is configured to:

extract a length token and an exponent token from the compressed signal data according to a predetermined bit number;

convert the length token into a block length of the data block; and convert the exponent token into an exponent of the data block.

8. The apparatus according to claim 7, wherein the mantissa sequence obtainment module is configured to:

determine the number of bits by which each signal data contained in the data block is compressed, according to the exponent;

determine a length of a mantissa sequence according to the block length of the data block and the number of bits by which the data block is compressed; and obtain the mantissa sequence from the compressed signal data according to the length of the mantissa sequence.

\* \* \* \* \*